AMPLIFIER DISSIPATION REDUCING SYSTEM

Filed Aug. 15, 1958

INVENTOR:
ROBERT B. DOME,
BY Joseph Levinson
HIS ATTORNEY.

United States Patent Office 3,039,061

Patented June 12, 1962

3,039,061
AMPLIFIER DISSIPATION REDUCING SYSTEM

Robert B. Dome, Geddes Township, Onondaga County, N.Y., assignor to General Electric Company, a corporation of New York Filed Aug. 15, 1958, Ser. No. 755,337
7 Claims. (Cl. 330—10)

Figure 1:
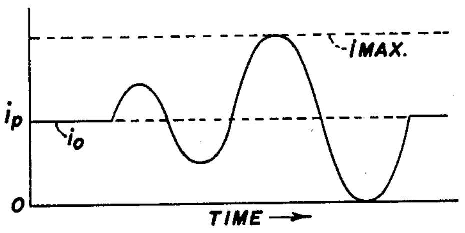

This invention relates to a system for reducing the amount of power dissipated on the output electrodes of amplifiers.

A conventional vacuum tube amplifier has an accompanying plate dissipation equal to plate input power minus the output power. When an input signal is applied to a class A amplifier, the useful output is obtained in the load circuit for the amplifier, and the plate dissipation is reduced, since a portion of the power is not dissipated in the load circuit. For example, an ideal class A audio frequency amplifier having an input of 10 watts would have a 10 watt plate dissipation when no signal is applied. When a maximum signal is applied to the amplifier, an output of 5 watts would be obtained, since an ideal class A amplifier has a maximum efficiency of 50%. The dissipation under the aforesaid conditions would be the plate input power minus the output power which would equal 5 watts. Even though the plate dissipation has been reduced by 5 watts, a vacuum tube having a 10 watt dissipation is still required in order to take care of the peak dissipation of 10 watts when no signal is applied. This would occur in speech, for example, at intervals between words. The same holds true for the collector electrode dissipation in a transistor amplifier.

It is an object of this invention to provide an amplifier having reduced output electrode dissipation without altering in any respect the input power or the useful output power.

Since the present invention contemplates reducing the output electrode dissipation of an amplifier, the possibility then exists of increasing the input power, and therefore obtaining more useful output power while operating the same amplifier at no more than rated dissipation.

Therefore, a further object of this invention is to provide an amplifier system having greater power handling capabilities than was previously possible when the amplifier was operated in a conventional manner.

In carrying out this invention, an auxiliary signal as well as the desired signal are applied to the input electrodes of an amplifier. The auxiliary signal is at a higher frequency and is automatically adjusted such that it does not affect the average value of current generated by the desired signal in the amplifier. The output circuit of the amplifier is provided with a load circuit tuned to the auxiliary signal as well as a conventional load circuit for the desired signal. The auxiliary signal output may be dissipated as heat in a resistance in the auxiliary signal load circuit.

These and other objects of this invention will be more clearly understood from the following description taken in connection with the accompanying drawings, and its scope will be apparent from the appended claims.

Figure 2:
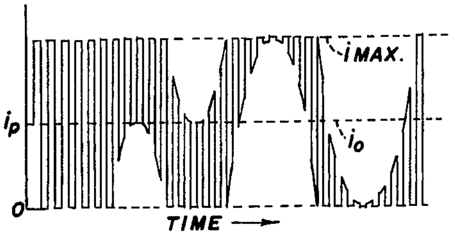
Figure 3:
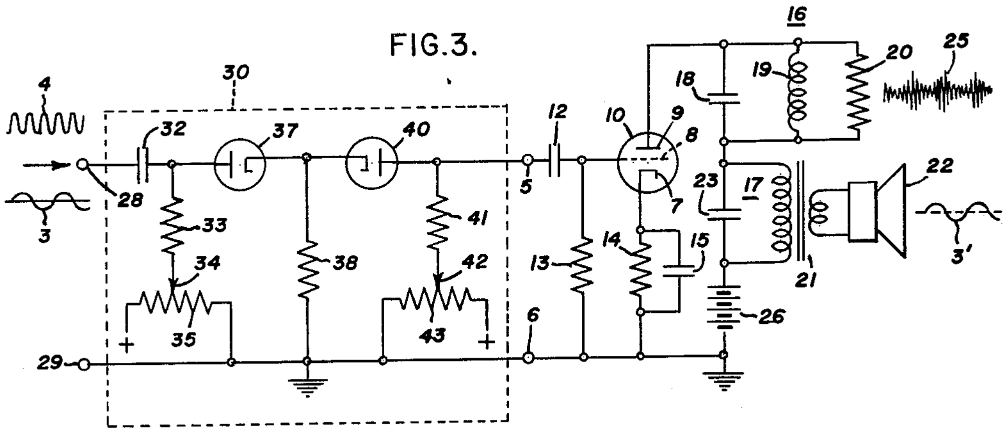
Figure 4:
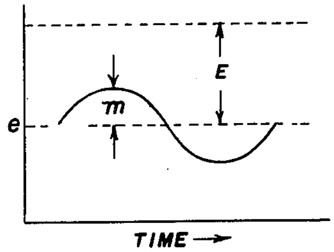
Figure 5:
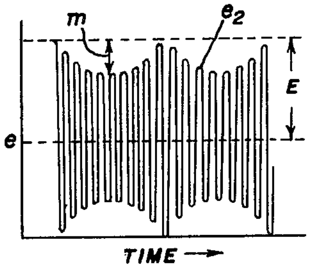
Figure 6:
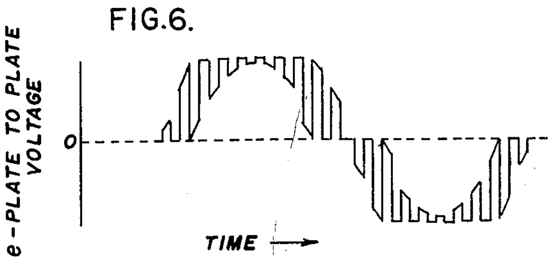

In the drawings:

FIGURE 1 shows a curve of conventional class A amplifier plate current versus time for a given desired signal, FIGURE 2 shows a curve of the amplifier plate current versus time of the desired signal shown in FIGURE 1 with an auxiliary signal added, FIGURE 3 is a circuit for reducing plate dissipation of a class A amplifier in accordance with this invention, FIGURES 4 and 5 are curves of a sinusoidal desired signal and sinusoidal auxiliary signal waves, respectively, which are used in computing the performance of the amplifier system of FIGURE 3, and FIGURE 6 is a curve of the plate to plate voltage versus time for class B amplifier operation in accordance with this invention.

Since peak output electrode dissipation of a class A amplifier is required only during a no signal condition, this invention contemplates providing some auxiliary input signal to the tube on all occasions except during the time when the tube is being driven to its peak output current by the desired signal. As an example, FIGURE 1 shows the plate current of a conventional class A amplifier for two cycles of audio frequency following a no signal region. A steady plate current $i_0$ exists whether the audio frequency is present or not since the average current for a class A amplifier is constant. FIGURE 2 shows the same desired signal with an auxiliary signal added. In accordance with this invention, the auxiliary signal must meet the requirements that (A) the frequencies of the added signal and its sidebands lie above the highest audio frequency present in the desired signal that is to be amplified and (B) the amplitude of the auxiliary signal must be adjusted automatically such that its peaks in the positive direction never cause the peak plate current to exceed the maximum current peak of the desired signal, nor its amplitude drive the added signal current to clipping on the negative peaks or, in other words, the added auxiliary signal should not affect the average value of the current generated by the desired signal. Note FIGURE 2 which clearly shows how requirement (B) is met. When the desired signal level is above $i_0$, the added signal has its upper cusps tangential to the maximum plate current ($i_{max}$) line, and likewise when the desired signal level is below $i_0$, the lower cusps of the added signal are tangential to the zero plate current line. When the desired signal crosses the $i_0$ line, the added signal is maximum with its lower cusps hitting zero current and its upper cusps hitting maximum plate current. It should be noted that the average value of plate current of the amplifier is unaffected by the auxiliary signal. The auxiliary or added signal may be described as being adjusted such that it rides evenly in a positive and negative direction about the low frequency signal as an axis so as not to disturb the average low frequency current values of the amplifier.

A circuit 30 for producing the voltage required at the input electrodes of an amplifier to produce a plate current as described in FIGURE 2 is shown in the dashed enclosure of FIGURE 3. The circuit 30 has a pair of diodes 37 and 40 having their cathodes connected together and through a common resistor 38 to ground. The diode 37 has its anode connected through a resistor 33 to an arm 34 on a potentiometer 35. One end of the potentiometer 35 is connected to a source of positive potential and the other end is connected to ground. Likewise, the diode 40 has its anode connected through a resistor 41 to an arm 42 on a potentiometer 43. The potentiometer 43 is connected between a source of positive potential and ground. A super-audible signal 4 and the desired signal 3 are applied to a pair of input terminals 28 and 29 of the circuit 30. The signals 3 and 4 are coupled by a blocking capacitor 32 to the anode of the diode 37. The diode 37 is biased into conduction by the positive potential across the potentiometer 35. The potentiometer arm 34 is set to just clip the negative-going half-cycles of the super-audible signal 4. This would occur when the super-audible wave 4 extends to its maximum in the negative direction, thus overcoming the positive bias on the diode 37 supplied by the potentiometer 35. The potentiometer arm 42 is adjusted to just clip the positive half-cycle of the super-audible wave 4. This would occur when the super-audible wave 4 extends in its maximum positive direction to overcome the positive bias provided by the potentiometer 42 on the anode of diode 40. Consequently, the diode 37 establishes the negative-going base of the auxiliary signal and the diode 40 establishes the positive-going peak of the auxiliary signal. Numerous circuits such as the circuit 30 may be devised for producing the required grid excitation voltages to an amplifier in accordance with this invention. The circuit 30 as shown in FIGURE 3 is suitable for operation with a class A amplifier. It is advantageous in its simplicity inasmuch as only two diodes are employed. The circuit 30 also has the advantage of being adjustable to handle various signal levels.

In accordance with this invention, an amplifier output circuit is provided in which the lower frequency desired signal is filtered out and proceeds to its usual load circuit, such as a loud speaker, and the high frequency auxiliary signal is separately filtered out and fed to another load circuit, such as a resistor for dissipation therein. FIGURE 3 shows one circuit which may be utilized for this purpose. The amplifier consists of a vacuum tube 10 having a cathode 7, a control grid 8 and a plate electrode 9. The desired signal and the auxiliary signal which was developed in the circuit 30 are applied to the input terminals 5 and 6 and are coupled by a capacitor 12 and a resistor 13 to the control grid 8 of the amplifier tube 10. The cathode 7 is connected to ground by a bias resistor 14 which is bypassed by a capacitor 15. The plate electrode 9 is serially connected to a load circuit 16, a load circuit 17 and a source of potential 26 which has its negative terminal connected to ground. The load circuit 16 consists of a capacitor 18, an inductor 19 and a resistor 20 all connected in shunt. The capacitor 18 and inductor 19 form a tank circuit which is tuned to the frequency of the super-audible signal 4 such that the output wave 25 resulting from the auxiliary signal component of the composite wave of FIGURE 2 is dissipated in the resistive load 20. The load circuit 17 consists of an audio output transformer 21, the secondary of which is connected to a low frequency load, such as the loud speaker 22. The primary of transformer 21 is by-passed for the auxiliary signal frequencies by a capacitor 23. The audio frequency wave 3' resulting from the low frequency component of the composite wave shown in FIGURE 2 which appears at the loud speaker is the amplified version of the desired signal input 3.

The use of the auxiliary signal produces an immediate benefit in reducing the plate dissipation without altering the input power or the useful output power. This may be shown by calculating the performance of the amplifier assuming an ideal tube and using the wave forms shown in FIGURES 4 and 5 which are a sinusoidal desired signal and a sinusoidal added signal, respectively. In this computation, the wave shown on FIGURE 4 is neither a small signal nor a maximum signal, but an intermediate value. Then, if E is the maximum the amplifier can deliver, the wave $e_1$ of the desired signal is expressed as $$e_1 = mE \sin \phi \qquad (1)$$

where $m$ is the intensity factor between 0 and 1

$$\phi = \mu t$$
$$t = \text{time}$$
$$\mu = 2\pi f_a$$
$$f_a = \text{audio frequency}$$

The added signal $e_2$ has the form of the following for the interval corresponding to the positive cusp of the desired signal:

$$e_2 = E \cos \omega t \, (1 - m \sin \phi) \qquad (2)$$

where $$\omega t = 2\pi f_r t$$
$$f_r = \text{auxiliary signal frequency}$$

The root mean square value of the desired signal is $$\frac{e_1}{\text{R.M.S.}} = \frac{Em}{\sqrt{2}} \qquad (3)$$

while the root mean square value of the auxiliary signal is (by integration)

$$\frac{e_2}{\text{R.M.S.}} = \frac{E}{\sqrt{2}} \sqrt{1 + \frac{m^2}{2} - \frac{4m}{\pi}} \qquad (4)$$

Assuming the two load resistors to be equal and equal to R, the useful audio power output is given by $$W_{01} = \frac{E^2 m^2}{2R} \qquad (5)$$

while the power output into resistor 20 for the added signal is $$W_{02} = \frac{E^2}{2R}\left(1 + \frac{m^2}{2} - \frac{4m}{\pi}\right) \qquad (6)$$

Thus, the total output power from the tube is the sum of Equations 5 and 6, or $$W_{OT} = \frac{E^2}{R}\left(\frac{1}{2} + \frac{3m^2}{4} - \frac{2m}{\pi}\right) \qquad (7)$$

Since the total (D.C.) power input to the tube is $$W_{IN} = \frac{E^2}{R} \qquad (8)$$

then the total dissipation is given by $W_{IN} - W_{OT}$, or $$W_{DT} = \frac{E^2}{R}\left(\frac{1}{2} - \frac{3m^2}{4} + \frac{2m}{\pi}\right) \qquad (9)$$

The following table is presented to illustrate the values of power in accordance with the aforesaid equations for a range of desired signal strength ($m$) from 0 to 1.

| Conventional Operation | | | | Operation with Auxiliary Signal | | | | | Tube efficiency |
|---|---|---|---|---|---|---|---|---|---|
| $m$ | $W_{IN}$ | $W_{01}$ | $W_D$ | $W_{IN}$ | $W_{01}$ | $W_{02}$ | $W_0$ total | $W_{DT}$ | |
| 0 | 1.0 | 0 | 1.0 | 1.0 | 0 | .5 | .5 | .5 | .5 |
| .2 | 1.0 | .02 | .98 | 1.0 | .02 | .3828 | .4028 | .5972 | .4 |
| .4 | 1.0 | .08 | .92 | 1.0 | .08 | .285 | .365 | .635 | .37 |
| .6 | 1.0 | .18 | .82 | 1.0 | .18 | .208 | .388 | .612 | .39 |
| .8 | 1.0 | .32 | .68 | 1.0 | .32 | .151 | .4710 | .529 | .47 |
| 1.0 | 1.0 | .5 | .5 | 1.0 | .5 | .114 | .614 | .386 | .61 |

Comparing the dissipation in columns $W_D$ and $W_{DT}$ for conventional operation and for operation with the auxiliary signal, respectively, it is readily apparent that the maximum dissipation at the tube anode is 1.0 for conventional operation but only .635 for auxiliary signal operation. Thus, the installed tube dissipation capacity can be reduced to 63.5% of the value required in conventional systems. Considered in a different way, the new method enables the power output of the present amplifier tube to be increased to $$\frac{1}{0.635}$$

or 1.57 times its conventional useful power output.

In the example given for purposes of disclosure, the wave shape of the auxiliary signal has been chosen to be sinusoidal with the plate circuit for the auxiliary signal tuned for the sinusoidal wave. A square wave input may be utilized for the auxiliary signal with the plate circuit for the auxiliary signal tuned for the fundamental component of the square wave, or the auxiliary signal load circuit of the amplifier may be very broad in response so as to resemble a video frequency amplifier, and produce essentially square waves of auxiliary signal from the square wave grid excitation. The degree of plate dissipation reduction depends on the choice of the wave shapes, and in general improves with the use of square waves.

The operation of FIGURE 3 has been described with reference to class A operation. However, the addition of auxiliary signals may also be applied to class B operation. For example, an auxiliary signal may be added to the desired signal to produce the plate to plate voltage shown in FIGURE 6 for class B operation. Class B operation is typified by the no signal plate current being essentially zero, and the positive and negative half-cycles of desired signal currents being handled by separate tubes. Note that FIGURE 6 for class B operation differs from FIGURE 2 for class A operation in that no auxiliary signal is present at zero signal level. Maximum auxiliary signal will occur at the instant when the desired signal has an amplitude equal to one-half the maximum attainable plate current.

Although the invention has been described with reference to vaccum tube amplifiers, it is also equally applicable, and probably more important to transistor amplifiers. One of the major problems confronted in dealing with transistor amplifiers resides in their limitations as far as power handling capabilities are concerned. Just as the plate electrode of a class A vacuum tube amplifier must be able to dissipate all of the power input during no signal periods, so must the collector electrode of the transistor class A amplifier handle all of the dissipation during no signal levels. Consequently, the power handling capabilities of a transistor amplifier may be increased using the present methods without altering physical characteristics of the transistor per se. FIGURE 3 may be altered to accommodate a transistor amplifier by merely substituting a transistor for the vacuum tube 10. For example, the collector electrode would replace plate 9, the emitter electrode would replace the cathode 7 and the base electrode would replace the control grid 8. Additionally, a resistor connected to a source of positive potential would be connected to the base electrode for biasing purposes. Semiconductor rectifiers could be utilized to replace the diodes shown in the circuit 30.

The amplifier dissipation reduction system embodied in this invention has been illustrated in FIGURE 3 with reference to triode amplifiers. Other multi-electrode amplifiers may be employed as well. For example, a tetrode or pentode type amplifier may be used in which the desired signal is applied to the control electrode and the auxiliary signal is applied to the screen grid of these tubes.

Although the invention has been described with reference to audio frequency amplifiers for use in low level systems, such as receivers, it is not limited thereto. Another application of this invention relates to transmitter amplifiers which are required to handle large amounts of power. Transmitter amplifier tubes require extremely high dissipation and in many instances require special cooling equipment. By applying the present invention to transmitter amplifiers, their power handling capacities could be increased or alternatively the amplifiers could be run much cooler to prolong their life and reduce expensive replacement cost.

Since other modifications varied to fit the particular operating requirements and environments will be apparent to those skilled in the art, the invention is not considered limited to the examples chosen for purposes of disclosure and covers all modifications and changes which do not constitute departures from the true spirit and scope of this invention.

What I claim as new and desire to secure by Letters Patent of the United States is:

1. An amplifier dissipation reducing system comprising an amplifier having input and output electrodes, means for applying a combined signal consisting of the sum of a desired signal and an auxiliary signal of higher frequency than said desired signal to said input electrodes, said last named means including means for automatically regulating the amplitude of said combined signal such that the positive and negative-going peaks generated by said desired signal at the output electrodes of said amplifier remain substantially unaffected by the presence of the auxiliary signal, a first load circuit for said desired signal, means coupled between the output electrodes of said amplifier and said first load circuit for applying said desired signal to said first load circuit, a second load circuit, and means coupled between said output electrodes and said second load circuit for coupling said auxiliary signal to said second load circuit.

2. An amplifier dissipation reducing system comprising an amplifier having input and output electrodes, means for applying a combined signal consisting of the sum of a desired signal and an auxiliary signal of greater frequency than said desired signal to said input electrodes, said last named means including means for automatically regulating the amplitude of said combined signal such that the output wave shape of the desired signal remains undisturbed, a first load circuit coupled to said output electrodes for receiving said auxiliary signal, and a second load circiut coupled to said output electrodes for receiving said desired signal.

3. An amplifier dissipation reducing system comprising an electron discharge device having a plate, a control grid and a cathode, means for applying a combined signal consisting of the sum of a desired signal and an auxiliary signal of higher frequency than said desired frequency between said control grid and said cathode, means for automatically regulating the amplitude of said combined signal such that positive-going and negative-going excursions of the desired signal are passed by said amplifier without alteration, a first load circuit coupled to said plate electrode for receiving said auxiliary signal, a second load circuit coupled to said plate electrode for receiving said desired signal.

4. An amplifier dissipation reducing system comprising an amplifier having input and output electrodes, circuit means connected to said input electrodes for applying thereto a combined signal consisting of the sum of a desired signal and an auxiliary signal having a frequency greater than said desired signal, means in said circuit means for automatically adjusting the amplitude of said combined signal such that the instantaneous value of current generated by said desired signal in said amplifier remains substantially constant and the wave shape of said desired signal remains the same, a first load circuit coupled to said output electrodes for receiving said desired signal, and a second load circuit coupled to said output electrodes for receiving said auxiliary signal.

5. An amplifier dissipation reducing system comprising an amplifier having input and output electrodes, circuit means connected to said input electrodes for applying thereto a combined signal consisting of the sum of a desired signal and an auxiliary signal having a frequency greater than said desired signal, said circuit means including means for automatically adjusting the amplitude of said combined signal such that the auxiliary signal rides evenly in a positive and negative direction about the desired signal as an axis so as not to affect the instantaneous desired signal current values or its wave form, a first load circuit coupled to said output electrodes for receiving said desired signal, and a second load circuit coupled to said output electrodes for receiving said auxiliary signal.

6. The structure defined in claim 5 wherein said circuit means consists of a pair of serially connected unilateral conducting devices having a common electrode interconnected, one of said unilateral conductive devices being biased to set the peak of positive half-cycle of the auxiliary signal produced thereby and the other of said unilateral conducting devices being biased to establish the base of the negative half-cycle of the auxiliary signal.

7. An amplifier dissipation reducing system comprising an amplifier having input and output electrodes, first and second unilateral conductive devices to said common impedance, an adjustable impedance connected to each of the other electrodes of said first and second unilateral conducting devices, means for applying a desired signal to the other electrode of said first unilateral conducting device, means for applying a high frequency signal of greater frequency than said desired signal to the said other electrode of said first unilateral conducting device, means for coupling the composite signal output from the other electrode of said second unilateral conducting device to the input electrodes of said amplifier, a first load circuit coupled to the output electrodes of said amplifier for receiving said auxiliary signal, and a second load circuit coupled to said output electrodes for receiving said desired signal.

References Cited in the file of this patent

UNITED STATES PATENTS

| | | |
|---|---|---|
| 2,260,585 | Senauke | Oct. 28, 1941 |
| 2,435,547 | Nikis | Feb. 3, 1948 |
| 2,498,678 | Grieg | Feb. 28, 1950 |
| 2,657,280 | Skolnikoff | Oct. 27, 1953 |

FOREIGN PATENTS

| | | |
|---|---|---|
| 871,105 | France | Jan. 3, 1942 |